US006512399B1

United States Patent
DeGeronimo et al.

(10) Patent No.: US 6,512,399 B1
(45) Date of Patent: Jan. 28, 2003

(54) OFFSET-FREE RAIL-TO-RAIL DERANDOMIZING PEAK DETECT-AND-HOLD CIRCUIT

(75) Inventors: Gianluigi DeGeronimo, Nesconset, NY (US); Paul O'Connor, Bellport, NY (US); Anand Kandasamy, Coram, NY (US)

(73) Assignee: Brookhaven Science Associates LLC, Upton, NY (US)

( * ) Notice: Subject to any disclaimer, the term of this patent is extended or adjusted under 35 U.S.C. 154(b) by 0 days.

(21) Appl. No.: 09/999,237

(22) Filed: Dec. 3, 2001

(51) Int. Cl.$^7$ .................................................. G11C 7/06
(52) U.S. Cl. ........................................... 327/62; 327/59
(58) Field of Search ............................... 327/54, 58–60, 327/62, 67, 73, 89, 90, 91, 94, 95, 96; 341/122

(56) References Cited

U.S. PATENT DOCUMENTS

| | | | |
|---|---|---|---|
| 4,634,895 A | | 1/1987 | Luong .......................... 327/58 |
| 5,302,863 A | | 4/1994 | Walley et la. ................. 327/58 |
| 5,321,656 A | | 6/1994 | Kogan ......................... 365/203 |
| 5,428,307 A | | 6/1995 | Dendinger ................... 327/62 |
| 5,721,563 A | * | 2/1998 | Memida ....................... 327/94 |
| 5,796,278 A | * | 8/1998 | Osborn et al. .............. 327/108 |
| 5,969,545 A | | 10/1999 | Assadian et al. ............. 327/62 |
| 6,051,998 A | * | 4/2000 | Lee et al. .................... 327/307 |
| 6,069,502 A | * | 5/2000 | Preslar et al. ................. 327/91 |
| 6,188,250 B1 | | 2/2001 | Voorman et al. .............. 327/58 |
| 6,191,621 B1 | | 2/2001 | Ota .............................. 327/58 |
| 6,208,173 B1 | | 3/2001 | Redman-White ............ 327/59 |

OTHER PUBLICATIONS

M.W. Kruiskamp, D.M.W. Leenaerts, "A CMOS Peak Detect Sample And Hold Circuit", IEEE Transactions on Nuclear Science, vol. 41, No. 1, pp. 295–298, 1994.

K. Koli, K. Halonen, "Low Voltage MOS–Transistor–Only Precision Current Peak Detector With Signal Independent Discharge Time Constant", Proc. IEEE International Symposium on Circuits and Systems (ISCAS '97), Hong Kong, Jun. 1997.

A.M.L.S. Morgado, J.B. Simoes, J. Landeck, M.F. Correia, P. Almeida, J.L. Malaquias, C.M. Correia, "A Pulse Processing Station", Proc. IEEE Nuclear Science Symposium (NSS '97), Albuquerque, NM, USA, Nov. 1997.

L. Fabris, P.G. Allen, J.J. Bucherm N.M. Edelstein, D.A. Landis, N.W. Madden, D.K. Shuh, "Fast Peak Detector Stretchers For Use In XAFS Applications", Proc. IEEE Nuclear Science Symposium (NSS '98), Toronto, Canada, Nov. 1997.

K.O. Wessendorf, J.C. Lund, B.A. Brunett, G.R. Laguna, J.W. Clements, "Very Low–Power Consumption Analog Pulse Processing ASIC For Semiconductor Radiation Detectors", Proc. IEEE Nuclear Science Symposium (NSS '98), Toronto, Canada, Nov. 1998.

(List continued on next page.)

Primary Examiner—My-Trang Nu Ton
(74) Attorney, Agent, or Firm—Margaret C. Bogosian

(57) ABSTRACT

A peak detect-and-hold circuit eliminates errors introduced by conventional amplifiers, such as common-mode rejection and input voltage offset. The circuit includes an amplifier, three switches, a transistor, and a capacitor. During a detect-and-hold phase, a hold voltage at a non-inverting in put terminal of the amplifier tracks an input voltage signal and when a peak is reached, the transistor is switched off, thereby storing a peak voltage in the capacitor. During a readout phase, the circuit functions as a unity gain buffer, in which the voltage stored in the capacitor is provided as an output voltage. The circuit is able to sense signals rail-to-rail and can readily be modified to sense positive, negative, or peak-to-peak voltages. Derandomization may be achieved by using a plurality of peak detect-and-hold circuits electrically connected in parallel.

32 Claims, 3 Drawing Sheets

OTHER PUBLICATIONS

M.N. Ericson, M.L. Simpson, C.L. Britton, M.D. Allen, R.A. Kroeger, S.E. Inderhees, "A Low–Power CMOS Peak Detect And Hold Circuit For Nuclear Pulse Spectroscopy", IEEE Transactions on Nuclear Science, vol. 42, No. 4, pp. 724–728, 1995.

U. Jagadish, C.L. Britton, Jr., M.N. Ericson, W.L. Bryan, W.G. Schwarz, M.E. Read, R.A. Kroeger, "A Preamplifier–Shaper–Stretcher Integrated Circuit System For Use With Germanium Strip Detectors", IEEE Transactions on Nuclear Science, vol. 47, No. 6, pp. 1868–1871, 2000.

P. Casoli, P.F. Manfredi, "On The Design Of Pulse Peak Stretchers", IEEE Transactions on Nuclear Science, vol. 16, no. 1, pp. 392–397, 1969.

W. Haas, P. Dullenkopf, "A Novel Peak Amplitude And Time Detector For Narrow Pulse Signals", IEEE Transactions on Instrumentation and Measurement, vol. 35, No. 4, pp. 547–550, 1986.

* cited by examiner

US 6,512,399 B1

OFFSET-FREE RAIL-TO-RAIL DERANDOMIZING PEAK DETECT-AND-HOLD CIRCUIT

This invention was made with Government support under contract number DE-AC02-98CH10886, awarded by the U.S. Department of Energy. The Government has certain rights in the invention.

BACKGROUND OF THE INVENTION

1. Field of the Invention

The present invention relates generally to electronic, peak detect-and-hold circuits and more particularly to a two-phase, peak detect-and-hold circuit, which is able to cancel offset voltages and sense rail-to-rail input signals.

2. Description of the Prior Art

In many signal processing applications, it is necessary to record the peak value of a time-varying waveform. The current state of the art in integrated peak detectors in CMOS (complementary metal-oxide semiconductor) devices suffers from two major limitations: offset voltage and the inability to process signals over the full range of the supply voltage. Both of these problems affect the performance of the circuit more acutely in modem low-voltage CMOS technologies.

In high sampling rate systems with randomly arriving signals, peak detectors suffer from an inherent inefficiency. A conventional peak detector is insensitive to the input from the time a peak is detected until the held voltage is read out and converted by an ADC (analog-to-digital converter), which provides a reset signal for a capacitor storing the held voltage.

Pulses that arrive during this interval are not recorded by the system, and the quantity of these unrecorded pulses cannot be monitored. To minimize this inefficiency, the speed of acquiring readout data must be increased in order to keep up with the minimum inter-arrival time of the input pulse stream. However, acquisition speed is severely limited by technology and the tolerance to increases in the cost of the ADC.

OBJECTS AND SUMMARY OF THE INVENTION

It is an object of the present invention to provide a peak detect-and-hold circuit that is able to substantially cancel offset voltage and common-mode rejection error.

It is a further object of the present invention to provide a peak detect-and-hold circuit that is able to sense rail-to-rail input signals.

It is another object of the present invention to provide a peak detect-and-hold circuit that may readily be modified to detect positive, negative, or peak-to-peak voltages.

It is still a further object of the present invention to provide a two-phase, peak detect-and-hold circuit that is able to automatically switch from a detect-and-hold phase to a readout phase.

It is still another object of the present invention to provide a peak detect-and-hold circuit that provides analog buffering.

It is yet a further object of the present invention to provide a peak detect-and-hold circuit that includes derandomizing architecture that circumvents restrictions on the speed of acquiring randomly distributed input signals.

A two-phase peak detect-and-hold circuit formed in accordance with one form of the present invention, which incorporates some of the preferred features, includes an amplifier, three switches, a transistor, and a capacitor. The first switch is connected between an input voltage signal and an inverting input terminal of the amplifier. The third switch is connected between an output terminal of the amplifier, which provides an output voltage, and a gate of the transistor. The second switch is connected between the inverting input terminal of the amplifier and its output terminal, and the non-inverting input terminal of the amplifier is connected to a drain of the transistor. The capacitor is connected in series between the non-inverting input terminal and ground. The source of the transistor is preferably connected to a voltage source.

During a detect-and-hold phase, the first and third switches are preferably closed and the second switch is preferably open. In this phase, a hold voltage at the non-inverting input terminal of the amplifier tracks the input voltage signal and when a peak is reached, the transistor is switched off, thereby storing a peak voltage in the capacitor.

During a readout phase, the first and third switches are preferably open and the second switch is preferably closed. In this phase, the circuit functions as a unity gain buffer, in which the voltage stored in the capacitor is provided as the output voltage. Thus, despite voltage dependencies, the circuit formed in accordance with the present invention is able to cancel offset voltage and common-mode rejection errors.

The circuit is able to sense signals rail-to-rail and can readily be modified to sense positive, negative, or peak-to-peak voltages. Derandomization may be achieved by using a plurality of peak detect-and-hold circuits suitably connected in parallel. A second embodiment of the peak detect-and-hold circuit formed in accordance with one form of the present invention, which incorporates some of the preferred features, includes a plurality of capacitors suitably connected in parallel to achieve substantial savings in power.

These and other objects, features, and advantages of this invention will become apparent from the following detailed description of illustrative embodiments thereof, which is to be read in connection with the accompanying drawing.

DETAILED DESCRIPTION OF THE PREFERRED EMBODIMENTS

Figure 1:
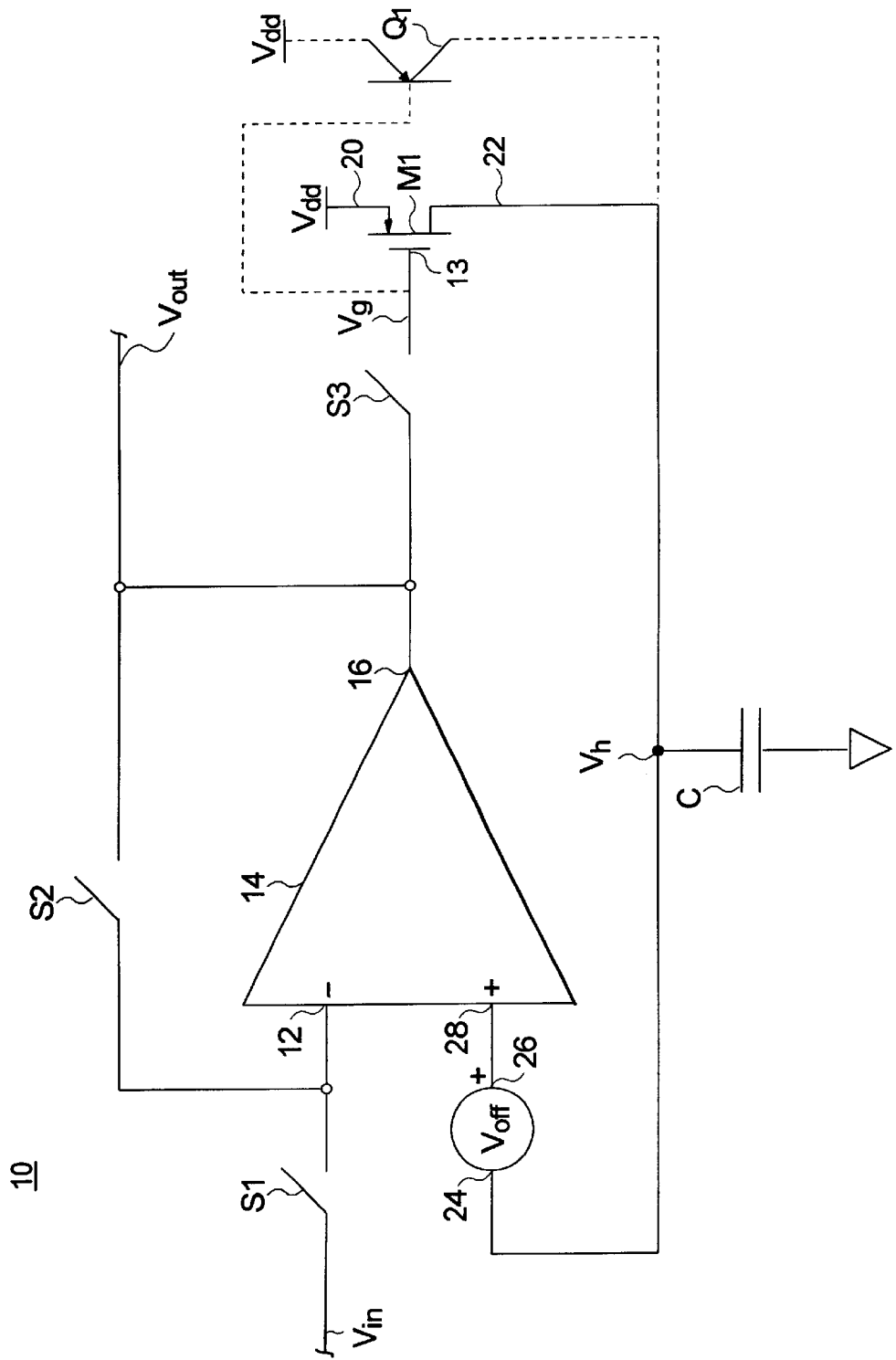
FIG. 1 is a schematic representation of an offset-free, peak detect-and-hold circuit formed in accordance with the present invention.

A simplified schematic of a preferred embodiment of a two-phase, peak detect-and-hold circuit 10 for positive pulses is shown in FIG. 1. A time-varying input voltage signal Vin is preferably applied to an inverting terminal 12 of an operational amplifier 14 through a switch S1.

The inverting terminal 12 is also preferably connected to an output terminal 16 of the amplifier 14 through a switch S2. The output terminal 16 preferably provides an output voltage Vout of the circuit 10. The output terminal 16 is also preferably connected to a gate 18 of a transistor M1 through a switch S3. A source voltage Vdd is preferably applied to a source 20 of the transistor M1 and a gate voltage Vg is measured at the gate 18 of the transistor M1 to automatically switch from a detect-and-hold phase to a readout phase.

The input offset voltage of the amplifier 14 is represented by a voltage source Voff. A negative terminal 24 of the voltage source Voff is shown as being connected to a drain 22 of the transistor M1 and a positive terminal 26 of the voltage source Voff is shown as being connected to a non-inverting terminal 28 of the amplifier 14.

A capacitor C is preferably connected in series between ground and the negative terminal 24 of the voltage source Voff. The capacitor C stores a hold voltage Vh. Alternatively, it is anticipated that a bipolar junction transistor Q1 may be substituted for the metal-oxide semiconductor (MOS) transistor M1, as shown by the dotted lines in FIG. 1.

During a first phase (detect-and-hold phase), the switches S1 and S3 are preferably closed and the switch S2 is preferably open. In this phase, the hold voltage Vh at the non-inverting input of the amplifier 14 preferably tracks the input voltage signal Vin. When the input voltage signal Vin reaches a peak, the gate voltage Vg preferably switches the transistor M1 off, thereby storing a peak voltage Vh in the capacitor C.

A peak value Vpk of the voltage Vh, which is stored in C, is affected by an error Vh–Vpk. This error is preferably provided by equation (1) as follows:

$$Vh - Vpk \approx -Voff + \frac{Vdd - Vth}{Ad} - \frac{Vpk}{CMRR}, \quad (1)$$

where Voff is the offset voltage of the amplifier 14, Ad is a differential gain of the amplifier 14, CMRR is a common-mode rejection ratio of the amplifier 14, and Vth is a threshold voltage of the transistor M1.

During a second phase (readout phase), the switches S1 and S3 are preferably open and the switch S2 is preferably closed automatically in response to the gate voltage Vg. In this phase, the circuit 10 preferably functions as a unity gain buffer.

Therefore, the error voltage due to input offset voltage Voff and finite CMRR, which was subtracted from the input voltage signal Vin and stored in the capacitor during the first phase, is essentially added back during the second phase when the output voltage Vout is read.

Thus, the input offset voltage Voff is substantially cancelled by the peak detect-and-hold circuit formed in accordance with the present invention. This feature becomes particularly advantageous when dealing with reduced operating voltage ranges, such as submicron CMOS technology, which has a very low supply voltage.

The output voltage Vout is affected, with respect to the stored hold voltage Vh, by an error Vout–Vh, which is preferably provided by equation (2) as follows:

$$V_{out} - Vh \approx Voff - \frac{Vpk}{Ad} + \frac{Vpk}{CMRR}. \quad (2)$$

A total output error Vout–Vpk, which affects the performance of the overall circuit, is preferably provided by equation (3) as follows:

$$Vout - Vpk \approx \frac{Vdd - Vth - Vpk}{Ad}. \quad (3)$$

The total output error is preferably only limited by the finite differential gain Ad of the amplifier 14.

If a rail-to-rail configuration is used for the amplifier, the circuit is preferably able to sense input signals rail-to-rail. Since rail-to-rail amplifiers have an offset voltage that depends on the input common-mode voltage, the offset cancellation achieved by this new circuit is particularly advantageous. The gate voltage Vg may be used to determine whether a peak has been detected and whether the peak is being held. An appropriate logic circuit automatically controls the opening and closing of the switches S1–S3 by monitoring the gate voltage Vg. The peak detect-and-hold circuit may alternatively be implemented without switch S3. However, the use of switch S3 is preferred to ensure that the transistor M1 is off during the second phase.

A preferred application of the peak detect-and-hold circuit is in nuclear pulse processing, wherein nuclear disintegrations occur randomly according to a Poisson process. An average rate of these disintegrations may be calculated. However, measured results typically fluctuate widely from this average, which causes a significant number of peaks to be missed, particularly if an analog-to-digital converter (ADC) samples at the average rate. Derandomization refers to a method of compensating for the randomness of the input signal to achieve a more constant output rate that can more readily be handled by the constant sampling rate of the ADC.

In accordance with the subject invention, derandomization may be achieved by using N>1 two-phase peak detect-and-hold circuits, which are electrically connected in parallel. The offset-free operation of the peak detect-and-hold circuit formed in accordance with the present invention is particularly advantageous in derandomization since individual compensation for the input offset voltage of each of the circuits, which varies independently, is not required. Thus, a record of which of the paralleled circuits detected which pulse and subsequent offset compensation for these pulses is not required since each circuit uniformly provides an output that is substantially free of offset error.

Figure 2:
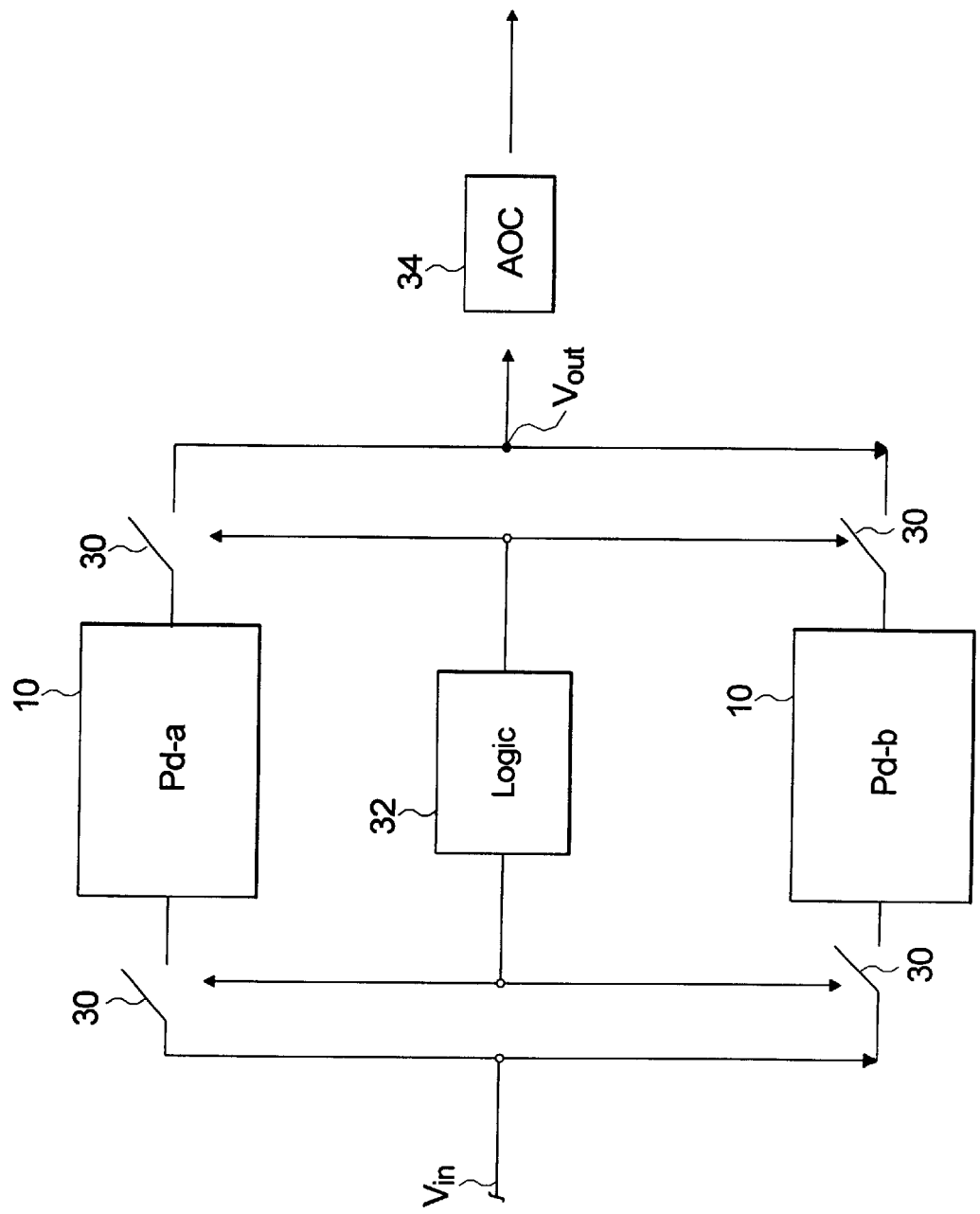
FIG. 2 is a block diagram of a derandomizing peak detect-and-hold circuit formed in accordance with the present invention.

As shown in FIG. 2 for the case N=2, the single peak detector may be replaced by an array of peak detectors and series switches 30. Each peak detector preferably includes a structure identical to that of FIG. 1.

A first peak detector Pd-a and a second peak detector Pd-b are preferably electrically connected in parallel between the input voltage signal Vin and the output voltage Vout. Each of the series switches 30 are then preferably electrically connected in series between the peak detectors and the input and output voltages.

Thus, at least one of the peak detectors (Pd-a, Pd-b) may be selectively connected in series between the input voltage signal Vin and the output voltage Vout. The series switches 30 are preferably controlled by a logic circuit 32 and the output voltage Vout is preferably connected to an input of an analog-to-digital converter (ADC) 34.

Once the first peak detector PD-a has stored a peak, the control logic circuit 32, which operates in a ping-pong fashion, preferably makes the second peak detector PD-b immediately available. As a consequence, the peak held in the first peak detector PD-a is not required to be read before the next pulse arrives. In addition, the analog-to-digital converter (ADC) 34, which preferably follows the peak detectors, does not require a clock that is faster than the average pulse arrival rate.

The subject invention may readily be extended to any number N>2 of peak detectors. An analog first-in, first-out buffer memory of depth N may thereby be created, which enables such a circuit to detect N consecutive pulses spaced relatively closely together in time.

Figure 3:
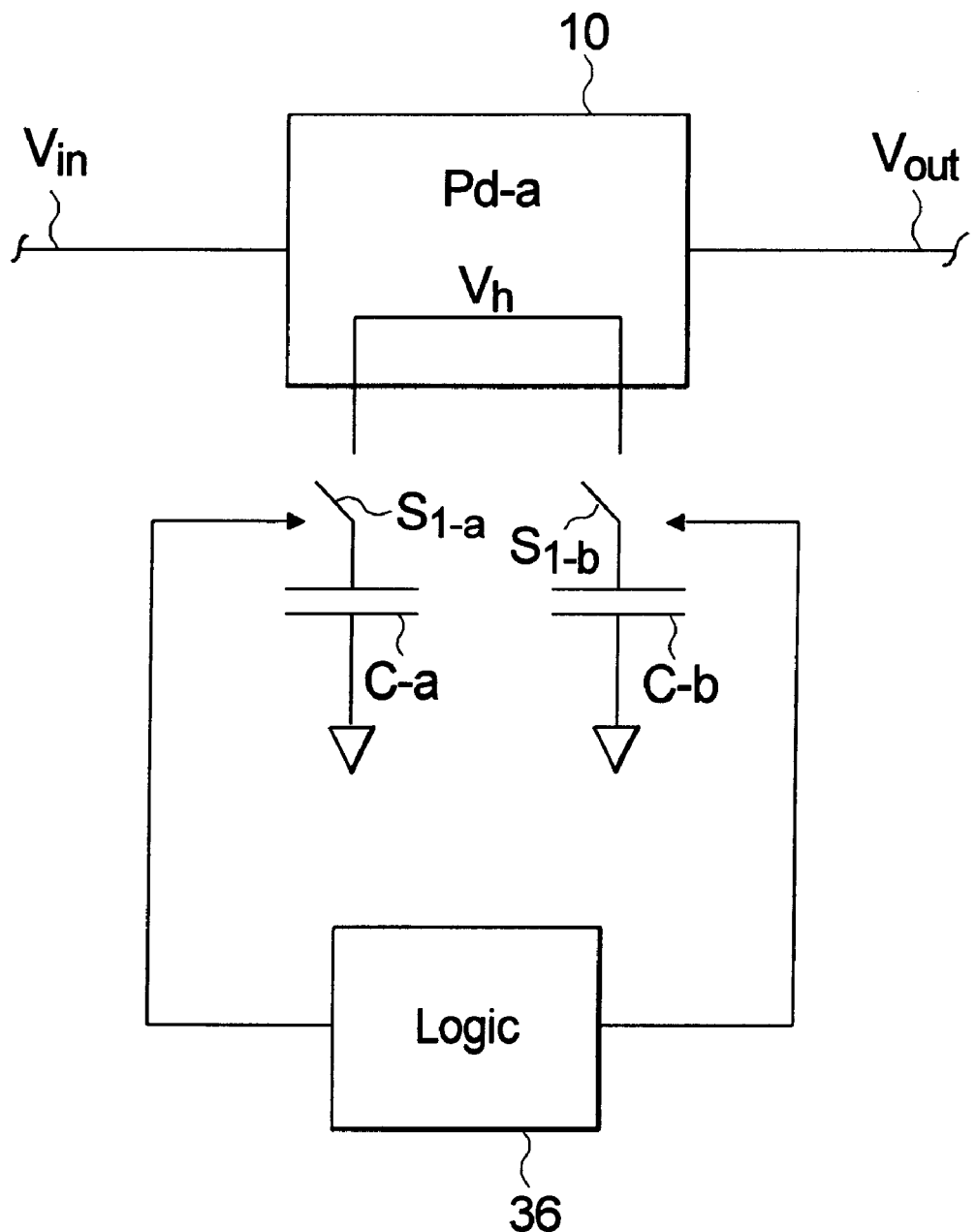
FIG. 3 is a block diagram of a low-power embodiment of the peak detect-and-hold circuit formed in accordance with the present invention.

Alternatively, if power is a concern, each peak detector shown in FIG. 2 may be replaced by the configuration shown in FIG. 3, which is an embodiment that includes N=2 capacitors. The hold capacitor C shown in FIG. 1 is essentially replaced by an array of N>1 capacitors (C-a, C-b) and series switches (S1-a, S1-b).

Thus, the series combination of the capacitor C-a and the series switch S1-a and the series combination of the capacitor C-b and the series switch S1-b are electrically connected in parallel between the non-inverting terminal 28 of the amplifier 14 shown in FIG. 1 and ground. A queuing logic circuit 36 preferably controls the series switches (S1-a, S1-b).

Once either of the capacitors (C-a, C-b) stores a peak, the queuing logic circuit 36 preferably makes the next capacitor immediately available. The queuing logic circuit 36 preferably connects each capacitor to the corresponding peak detector set in the second phase, which enables the sampled values to be read in the same sequence that they were written.

The use of a two-phase approach to canceling the error introduced by the offset voltage and finite common-mode rejection ratio of the amplifier used in the detection loop has not heretofore been accomplished. These errors are critical factors affecting the performance of conventional peak detect-and-hold circuits.

Thus, peak detect-and-hold circuits formed in accordance with the present invention are able to substantially cancel common-mode rejection error and sense rail-to-rail input signals. These circuits may also be readily modified to detect positive, negative, or peak-to-peak voltages and automatically switch from a detect-and-hold phase to a readout phase. In addition, the peak detect-and-hold circuits formed in accordance with the present invention may be configured to achieve derandomization of a Poisson distributed input signal and may readily be used in designs that require analog buffering.

Although illustrative embodiments of the present invention have been described herein with reference to the accompanying drawing, it is to be understood that the invention is not limited to those precise embodiments, and that various other changes and modifications may be effected therein by one skilled in the art without departing from the scope or spirit of the invention.

What is claimed is:

1. A peak detect-and-hold circuit, which comprises:
   an amplifier, the amplifier including an inverting input terminal, a non-inverting input terminal, and an output terminal, the output terminal outputting an output voltage;
   a first switch, the first switch being electrically connected in series between an input voltage signal and the inverting input terminal of the amplifier, the first switch being directly coupled to the inverting input terminal of the amplifier;
   at least one capacitor, the at least one capacitor being electrically connected in series between the non-inverting input terminal of the amplifier and ground;
   a current source, the current source being connected to the non-inverting input terminal of the amplifier, the current source providing current to the at least one capacitor; and
   a second switch, the second switch being electrically connected in series between the inverting input terminal of the amplifier and the output terminal of the amplifier.

2. A peak detect-and-hold circuit as defined by claim 1, further comprising a third switch, the third switch being electrically connected in series between the output terminal of the amplifier and a control terminal of the current source.

3. A peak detect-and-hold circuit as defined by claim 2, wherein the circuit includes a first phase, the first switch and the third switch being closed during the first phase, the second switch being open during the first phase, an input voltage representative of the input voltage signal being substantially detected and stored in the at least one capacitor during the first phase.

4. A peak detect-and-hold circuit as defined by claim 3, wherein the circuit includes a second phase, the first switch and the third switch being open during the second phase, the second switch being closed during the second phase, the input voltage stored in the at least one capacitor being substantially outputted to the output terminal of the amplifier during the second phase.

5. A peak detect-and-hold circuit as defined by claim 2, further comprising a second logic circuit, the second logic circuit controlling at least one of the first switch, the second switch, and the third switch.

6. A peak detect-and-hold circuit as defined by claim 1, further comprising a fourth switch, the fourth switch being electrically connected in series between the current source and the at least one capacitor.

7. A peak detect-and-hold circuit as defined by claim 6, further comprising a first logic circuit, the first logic circuit controlling the fourth switch electrically connected in series between the current source and the at least one capacitor.

8. A peak detect-and-hold circuit as defined by claim 1, wherein the current source includes at least one complementary metal-oxide semiconductor transistor, the at least one complementary metal-oxide semiconductor device including a gate terminal, a source terminal, and a drain terminal.

9. A peak detect-and-hold circuit as defined by claim 8, wherein the source terminal of the complementary metal-oxide semiconductor device is electrically connected to a supply voltage.

10. A peak detect-and-hold circuit as defined by claim 8, wherein the circuit includes a first phase, the first switch being closed during the first phase, the second switch being open during the first phase, an input voltage representative of the input voltage signal being substantially detected and stored in the at least one capacitor during the first phase, the circuit including a second phase, the first switch being open during the second phase, the second switch being closed during the second phase, the input voltage stored in the at least one capacitor being substantially outputted to the output terminal of the amplifier during the second phase, the peak detect-and-hold circuit automatically switching between the first phase and the second phase in response to voltage at the gate terminal.

11. A peak detect-and-hold circuit as defined by claim 8, wherein the circuit includes a first phase, the first switch and the third switch being closed during the first phase, the second switch being open during the first phase, an input voltage representative of the input voltage signal being substantially detected and stored in the at least one capacitor during the first phase, the circuit including a second phase, the first switch and the third switch being open during the second phase, the second switch being closed during the second phase, the input voltage stored in the at least one capacitor being substantially outputted to the output terminal of the amplifier during the second phase, the peak detect-and-hold circuit automatically switching between the first phase and the second phase in response to voltage at the gate terminal.

12. A peak detect-and-hold circuit as defined by claim 1, wherein the current source includes at least one bipolar-junction transistor, the at least one bipolar-junction transistor including a base terminal, a collector terminal, and an emitter terminal.

13. A peak detect-and-hold circuit as defined by claim 12, wherein the emitter terminal of the bipolar-junction transistor is electrically connected to a supply voltage.

14. A peak detect-and-hold circuit as defined by claim 1, wherein the circuit includes a first phase, the first switch being closed during the first phase, the second switch being open during the first phase, an input voltage representative of the input voltage signal being substantially detected and stored in the at least one capacitor during the first phase.

15. A peak detect-and-hold circuit as defined by claim 14, wherein the circuit includes a second phase, the first switch being open during the second phase, the second switch being closed during the second phase, the input voltage stored in the at least one capacitor being substantially outputted to the output terminal of the amplifier during the second phase.

16. A derandomizing peak detect-and-hold circuit, which comprises:
a plurality of peak detect-and-hold circuits, at least one of the plurality of peak detect-and-hold circuits being selectively connected electrically in series with an input voltage signal, at least one of the plurality of peak detect-and-hold circuits comprising:
an amplifier, the amplifier including an inverting input terminal, a non-inverting input terminal, and an output terminal, the output terminal outputting an output voltage;
a first switch, the first switch being electrically connected in series between an input voltage signal and the inverting input terminal of the amplifier, the first switch being directly coupled to the inverting input terminal of the amplifier;
at least one capacitor, the at least one capacitor being electrically connected in series between the non-inverting input terminal of the amplifier and ground;
a current source, the current source being connected to the non-inverting input terminal of the amplifier, the current source providing current to the at least one capacitor; and
a second switch, the second switch being electrically connected in series between the inverting input terminal of the amplifier and the current source.

17. A derandomizing peak detect-and-hold circuit as defined by claim 16, further comprising a third switch, the third switch being electrically connected in series between the output terminal of the amplifier and a control terminal of the current source.

18. A derandomizing peak detect-and-hold circuit as defined by claim 17, wherein the circuit includes a first phase, the first switch and the third switch being closed during the first phase, the second switch being open during the first phase, an input voltage representative of the input voltage signal being substantially detected and stored in the at least one capacitor during the first phase.

19. A derandomizing peak detect-and-hold circuit as defined by claim 18, wherein the circuit includes a second phase, the first switch and the third switch being open during the second phase, the second switch being closed during the second phase, the input voltage stored in the at least one capacitor being substantially outputted to the output terminal of the amplifier during the second phase.

20. A derandomizing peak detect-and-hold circuit as defined by claim 16, further comprising a fourth switch, the fourth switch being electrically connected in series between the current source and the at least one capacitor.

21. A derandomizing peak detect-and-hold circuit as defined by claim 20, further comprising first logic circuit, the first logic circuit controlling the fourth switch electrically connected in series between the current source and the at least one capacitor.

22. A derandomizing peak detect-and-hold circuit as defined by claim 16, wherein the current source includes at least one complementary metal-oxide semiconductor transistor, the at least one complementary metal-oxide semiconductor device including a gate terminal, a source terminal, and a drain terminal.

23. A derandomizing peak detect-and-hold circuit as defined by claim 22, wherein the source terminal of the complementary metal-oxide semiconductor device is electrically connected to a supply voltage.

24. A derandomizing peak detect-and-hold circuit as defined by claim 22, wherein the circuit includes a first phase, the first switch being closed during the first phase, the second switch being open during the first phase, an input voltage representative of the input voltage signal being substantially detected and stored in the at least one capacitor during the first phase, the circuit including a second phase, the first switch being open during the second phase, the second switch being closed during the second phase, the input voltage stored in the at least one capacitor being substantially outputted to the output terminal of the amplifier during the second phase, the peak detect-and-hold circuit automatically switching between the first phase and the second phase in response to voltage at the gate terminal.

25. A derandomizing peak detect-and-hold circuit as defined by claim 22, wherein the circuit includes a first phase, the first switch and the third switch being closed during the first phase, the second switch being open during the first phase, an input voltage representative of the input voltage signal being substantially detected and stored in the at least one capacitor during the first phase, the circuit including a second phase, the first switch and the third switch being open during the second phase, the second switch being closed during the second phase, the input voltage stored in the at least one capacitor being substantially outputted to the output terminal of the amplifier during the second phase, the peak detect-and-hold circuit automatically switching between the first phase and the second phase in response to voltage at the gate terminal.

26. A derandomizing peak detect-and-hold circuit as defined by claim 16, wherein the current source includes at least one bipolar-junction transistor, the at least one bipolar-junction transistor including a base terminal, a collector terminal, and an emitter terminal.

27. A derandomizing peak detect-and-hold circuit as defined by claim 26, wherein the emitter terminal of the bipolar-junction transistor is electrically connected to a supply voltage.

28. A derandomizing peak detect-and-hold circuit as defined by claim 16, wherein the circuit includes a first phase, the first switch being closed during the first phase, the second switch being open during the first phase, an input voltage representative of the input voltage signal being substantially detected and stored in the at least one capacitor during the first phase.

29. A derandomizing peak detect-and-hold circuit as defined by claim 28, wherein the circuit includes a second phase, the first switch being open during the second phase, the second switch being closed during the second phase, the input voltage stored in the at least one capacitor being substantially outputted to the output terminal of the amplifier during the second phase.

30. A derandomizing peak detect-and-hold circuit as defined by claim 16, further comprising a second logic circuit, the second logic circuit controlling at least one of the first switch, the second switch, and the third switch.

31. A derandomizing peak detect-and-hold circuit as defined by claim 16, further comprising:
   a fifth switch, the fifth switch being electrically connected in series between at least one of the plurality of peak detect-and-hold circuits and the input voltage signal; and
   a sixth switch, the sixth switch being electrically connected in series between at least one of the plurality of peak detect-and-hold circuits and an output terminal.

32. A derandomizing peak detect-and-hold circuit as defined by claim 31, further comprising a third logic circuit, the third logic circuit controlling at least one of the fifth switch and the sixth switch.

* * * * *